(12) United States Patent
Komatsu et al.

(10) Patent No.: US 6,610,460 B2
(45) Date of Patent: Aug. 26, 2003

(54) EXPOSURE METHOD (75) Inventors: Masaya Komatsu, Ibaraki-ken (JP);
Kyoichi Suwa, Kanagwa-ken (JP);
Kazuo Ushida, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/195,394

(22) Filed: Jul. 16, 2002

(65) Prior Publication Data
US 2002/0177076 A1 Nov. 28, 2002

Related U.S. Application Data (63) Continuation of application No. 09/680,937, filed on Oct. 10, 2000, now abandoned, which is a continuation of application No. 09/050,032, filed on Mar. 30, 1998, now abandoned.

(30) Foreign Application Priority Data

Mar. 31, 1997 (JP) .......................................... 96445-1997

(51) Int. Cl.$^7$ ................................................. G03F 7/20
(52) U.S. Cl. ...................... 430/312; 430/394; 430/396; 430/494
(58) Field of Search ................................ 430/312, 394, 430/396, 494

(56) References Cited

U.S. PATENT DOCUMENTS

| | | | |
|---|---|---|---|
| 5,134,058 A | 7/1992 | Han | 430/327 |
| 5,753,417 A | 5/1998 | Ulrich | 430/312 |
| 5,853,923 A | 12/1998 | Tzu | 430/5 |

Primary Examiner—Kathleen Duda
(74) Attorney, Agent, or Firm—Armstrong, Westerman & Hattori, LLP (57) ABSTRACT

An exposure method comprises the steps of: providing a resist-coated substrate; providing a first mask including first and second regions having respective patterns formed therein; conducting a first exposure process in which the patterns in the first and second regions of the first mask are projected onto the substrate so as to expose first and second regions of the substrate which correspond to the patterns, respectively; and conducting a second exposure process after completion of said first exposure process so as to make an additional exposure of the second region of the substrate. By virtue of the incorporation of the second exposure process so as to make an additional exposure of the second region of the substrate, the resist linewidth which would be otherwise produced in the second region of the substrate by the first exposure process can be compensated through the second exposure process.

15 Claims, 6 Drawing Sheets

EXPOSURE METHOD

This application is a continuation of Ser. No. 09/680,937 filed Oct. 10, 2000, now abandoned which is a continuation of Ser. No. 09/050,032 filed Mar. 30, 1998, now abandoned.

BACKGROUND OF THE INVENTION

The present invention relates to an exposure method for exposing a resist-coated substrate, and more particularly, to such an exposure method suitable for use in a projection exposure process for printing patterns of various sizes and shapes onto a resist-coated substrate by projection exposure.

In semiconductor device fabrication, a mask having patterns formed thereon is used for transferring the patterns onto a photoresist-coated, photosensitized substrate by projection exposure, and the patterns formed on a single mask typically include line-and-space patterns and single-line patterns. A line-and-space pattern comprises crowded parallel lines extending adjacent to each other, while a single-line pattern comprises one or more lines which have no adjacent line extending close thereto. In general, those lines of the patterns on the mask which have the same linewidth will not necessarily provide the corresponding resist lines of the same linewidth (which are lines corresponding to the mask pattern formed by or in the resist on the substrate after development of the resist) even if the exposure light intensity is uniform over the exposure field.

A mask used in photolithographic process in semiconductor device fabrication typically has several regions defined thereon which provide different interproximity effects. For example, a memory device, such as a dynamic random-access-memory, has regions of crowded lines in which memory cells are spatially-periodically disposed as well as regions of peripheral circuits in which isolated-line patterns are confined. Thus, with the microminiaturization of semiconductor devices, various problems have arisen in this relation including a problem that patterns of different shapes have different space-to-image contrasts and a problem concerning the interproximity effects in which the resist linewidth corresponding to a pattern line is affected by the presence of adjacent pattern lines. These problems have been coped with so far by modifying the linewidth of the pattern lines on a mask for each of different regions on the mask, such that a uniform resist linewidth may be obtained after the development process.

Even within a local region which is homogeneous throughout itself, the resist-linewidth variation may occur between the center and border areas of a crowded-line region since these areas are subject to different interproximity effects. In such case, a certain technique has to be used to compensate for the variation, such as to modify the linewidth of the pattern lines formed on the mask within the border areas or to add compensating patters to the border areas.

Further, even patterns of the same shape and size, which are however located at different positions in the exposure field (say, one is located near the center of the field and the other near the peripheral edge of the field), may produce different resist linewidths due to the image-formation characteristics of the projection lens used. This is because a projection lens typically has image-formation characteristics in which the image quality is poorer at positions further away from the center and nearer to the peripheral edge of the exposure field. In addition, even patterns of the same shape and size and located at adjacent positions may produce considerably different resist linewidths, if they are oriented in different directions. Moreover, any variation in the exposure energy intensity within the exposure field may be a cause of this problem. Specifically, a local area in the exposure field having significantly higher exposure energy intensity is called a "hot spot", which may sometimes appears at the center of the exposure field. Such a hot spot causes variations in the resist linewidth. Other factors in the resist linewidth variation include: NA (numerical aperture) of the projection lens used in the projection exposure apparatus; NA of the illumination optical system of the apparatus; the shape of the aperture stop of the illumination optical system such as an annular aperture-stop; the wavelength of the exposure light (such as G-line or I-line from a mercury lamp or other light from an excimer laser); and the characteristics of the photoresist used. Accordingly, in order to eliminate or suppress the resist linewidth variation by modifying the mask, a lot of different masks have to be prepared for various setups of the projection exposure apparatus used and/or for various photoresists selected, resulting in a considerable expenditure for the masks.

BRIEF SUMMARY OF THE INVENTION

In view of the foregoing, it is an object of the present invention to provide an exposure method in which the resist lines obtained after the development process may have the same linewidth or may be equal to the intended linewidths even when patterns which are different in shape and/or size and are subject to different interproximity effects are transferred onto a resist-coated substrate by projection exposure.

It is another object of the present invention to provide a method of fabricating a semiconductor device using such an exposure method.

In accordance with an aspect of the present invention, there is provided an exposure method, comprising the steps of: providing a resist-coated substrate; providing a first mask including first and second regions having respective patterns formed therein; conducting a first exposure process in which the patterns in the first and second regions of the first mask are projected onto the substrate so as to expose first and second regions of the substrate which correspond to the patterns, respectively; and conducting a second exposure process after completion of the first exposure process so as to make an additional exposure of the second region of the substrate.

The second exposure process may comprise the step of making an exposure of the second region of the substrate with light having a substantially uniform exposure intensity throughout the second region of the substrate.

With this exposure method, by virtue of the incorporation of the second exposure process conducted after completion of the first exposure process so as to make an additional exposure of the second region of the substrate, the resist linewidth which would be otherwise produced in the second region of the substrate by the first exposure process can be modified through the second exposure process. Accordingly, the variation in the resist linewidth, which would be otherwise produced by the first exposure process where the patterns in the first and second regions of the first mask are different in shape and/or size and thus are subject to different interproximity effects, can be minimized through the second exposure process.

Further, the second exposure process may comprise the steps of removing away the first mask and providing a second mask having an opaque region corresponding to the first region of the first mask.

In such case, the second mask, which has an opaque region corresponding to the first region of the first mask, is used in place of the first mask so as to make the additional exposure. That is, a bias exposure is effected so that the resist linewidth in the second region of the substrate may be modified.

Moreover, the second exposure process may comprise the step of projecting again the pattern in the second region of the first mask onto the substrate so as to make the additional exposure of the second region of the substrate. In addition, the step of projecting again the pattern in the second region of the first mask onto the substrate may comprise the step of providing a second mask to be overlaid on the first mask, the second mask having an opaque region corresponding to the first region of the first mask. In such case, the additional exposure is effected with light passing the pattern in the second region of the first mask, so that the resist image on the substrate corresponding to that pattern is free from the deterioration of its shape, which could otherwise possibly occur due to the additional exposure.

In accordance with another aspect of the present invention, there is provided an exposure method, comprising the steps of: providing a resist-coated substrate; providing a first mask including a predetermined region having a pattern formed therein; conducting a first exposure process in which the pattern in the predetermined region of the first mask is projected onto the substrate so as to expose a region of the substrate which corresponds to the predetermined region of the first mask; providing a second mask including a partially-opaque region corresponding to the predetermined region of the first mask, the partially-opaque region having transmittance varying depending on the position in the partially-opaque region; and conducting a second exposure process in which the second mask is used to make an exposure of the substrate.

With this exposure method, the second exposure process may be conducted with the first mask removed away after completion of the first exposure process and using the second mask (the second mask includes the partially-opaque region corresponding to the predetermined region of the first mask and the partially-opaque region has transmittance varying depending on the position in the partially-opaque region) so as to make an exposure of the substrate. In this manner, the various resist linewidths which would be otherwise produced in the region of the substrate which corresponds to the predetermined region of the first mask by the first exposure process can be modified depending on the variations in the transmittance of the second mask. Accordingly, the variation in the resist linewidth for the patterns in the predetermined region of the first mask, which would be otherwise produced by the first exposure process where the patterns are different in shape and/or size and thus are subject to different interproximity effects, can be minimized through the second exposure process.

Further with this exposure method, the second exposure process may be conducted with the second mask overlaid on the first mask. In this manner, the deterioration of the shape of the resist image may be minimized.

Moreover, the step of providing the second mask may comprise the step of positioning the partially-opaque region in a plane off a conjugate plane that is conjugate to an exposed surface of the substrate. In this manner, any image of the partially-opaque region can be sufficiently blurred.

In accordance with a further aspect of the present invention, there is provided a method for fabricating a semiconductor device using any of the above exposure methods. With this fabrication method, high-quality semiconductor devices may be fabricated even if a mask having fine patterns differing in shape is used, since the resist linewidth(s) of any resist patterns which are subject to the interproximity effects of adjacent patterns may be compensated so as to provide the intended resist-linewidth(s).

BRIEF DESCRIPTION OF THE SEVERAL VIEWS OF THE DRAWINGS

The above and other objects, features and advantages of the present invention will be apparent from the following detailed description of preferred embodiments thereof, reference being made to the accompanying drawings, in which:

FIGS. 13 and 14 illustrate how the maximum possible variation in resist linewidth is reduced by techniques according to examples of the present invention, in which FIG. 13 shows the maximum possible variation in resist linewidth is halved by effecting a single bias exposure process to the substrate having exposed as shown in FIG. 12, and FIG. 14 shows the maximum possible variation in resist linewidth is further reduced by effecting a number of successive bias exposure processes to the substrate having been exposed as shown in FIG. 12.

DETAILED DESCRIPTION OF THE INVENTION

Referring now to the accompanying drawings, preferred embodiments of the present invention will be described in detail. Among different drawings like reference numerals are used to designate like elements, and repetitive description of the same elements are avoided for simplicity.

Figure 1:
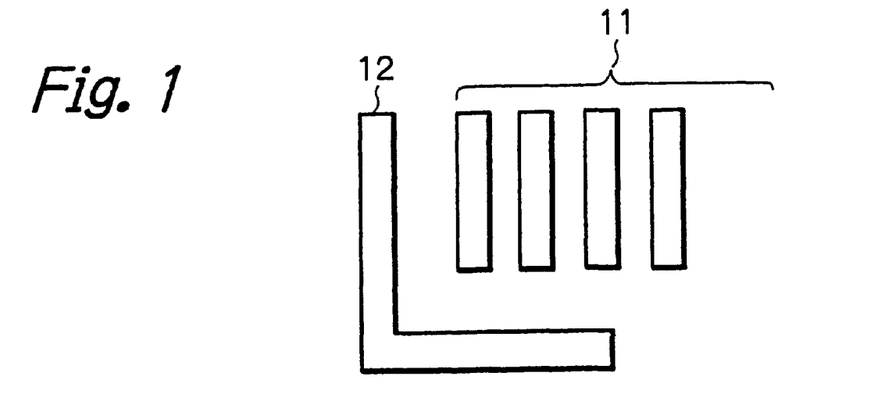
FIG. 1 is a schematic representation of a combination of a line-and-space pattern and an L-shaped pattern formed close to each other on a single mask.
Figure 2:
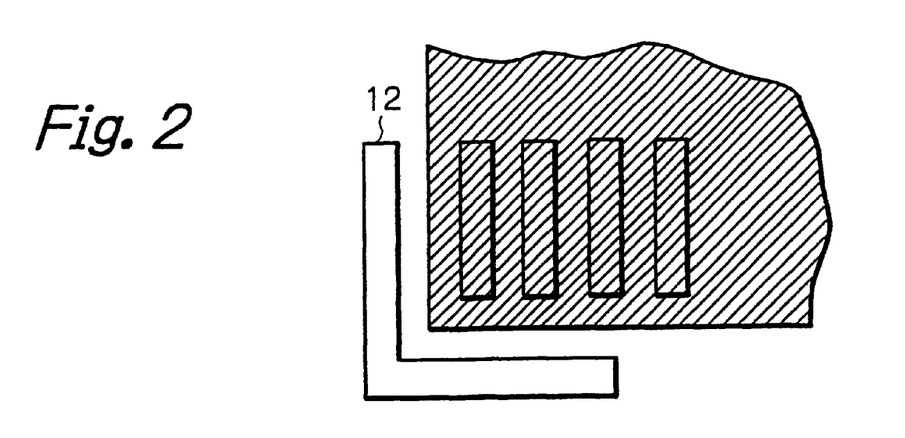
FIG. 2 is a schematic representation of the pattern combination of FIG. 1 with the line-and-space pattern being shaded by an opaque region of a bias mask.
Figure 3:
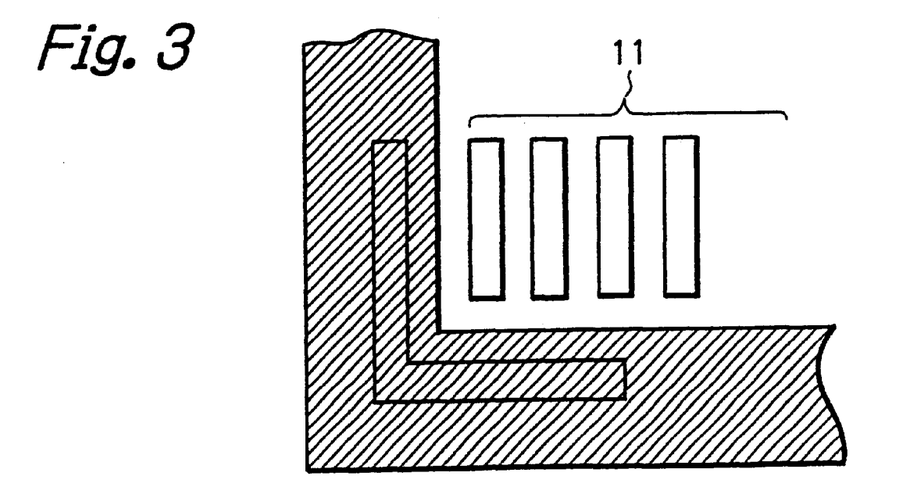
FIG. 3 is a schematic representation of the pattern combination of FIG. 1 with the L-shaped pattern being shaded by an opaque region of another bias mask.

With reference to FIGS. 1 to 3, a technique according to a first embodiment of the present invention will be described first. FIG. 1 shows a combination of two patterns formed on a single mask (or reticle). One is a line-and-space pattern 11 comprising crowed, parallel, component lines with spaces defined between them and the other is an L-shaped pattern 12 comprising two component lines each of which is an isolated line (or a line having no adjacent line). In FIG. 1, the L-shaped pattern 12 is disposed such that its two component lines are somewhat spaced apart from the line-and-space pattern 11 and extend along two sides of the generally rectangular line-and-space pattern 11.

With this pattern combination, the interproximity effects on the two component lines of the L-shaped pattern 12 are different from those on the component lines of the spatially-periodic, line-and-space pattern 11. Assume that a photo-sensitized (or resist-coated) substrate is exposed to a dose of exposure light which is optimized for the spatially-periodic, line-and-space pattern 11. In such case, the actual resist-linewidth on a wafer corresponding to the component lines of the L-shaped pattern 12 may be possibly different from the intended resist-linewidth since the exposure dose is not optimized for the L-shaped pattern 12. Thus, if the actual resist-linewidth for the L-shaped pattern tends to be larger than the intended resist-linewidth, a bias exposure may be effected only to the region of the wafer corresponding to the region of the L-shaped pattern 12, as shown in FIG. 2, so that a uniform resist-linewidth is achieved on the wafer for all the component lines of both patterns 11 and 12.

More specifically, the above description applies to a situation where a positive resist, with which the exposed regions become more soluble, is used and both of the line-and-space pattern 11 and the L-shaped pattern 12 are positive patterns, so that the areas on the wafer (or substrate) which correspond to the spaces between the component lines of the patterns on the mask are exposed.

Here, it is assumed that a mask having a line-and-space pattern (such as the pattern 11) and an isolated-line pattern (such as the L-shaped pattern 12) formed thereon is used and a positive-resist-coated wafer is exposed with a dose of exposure light which is so chosen as to cause the actual resist-linewidth for the line-and-space pattern to be equal to the intended resist-linewidth. If the resultant, actual resist-linewidth for the isolated-line pattern 12 is larger than the intended resist-linewidth, this indicates that the exposure dose optimized for the line-and-space pattern 11 is too low to be optimal for the isolated-line pattern or the L-shaped pattern 12.

According to the present invention, one or more bias exposures are effected to that region on the wafer which corresponds to the region of the isolated-line pattern 12 on the mask, so as to reduce the resist linewidth in that region. In this manner, the resist linewidth for the isolated-line pattern 12 may be caused to be equal to the intended resist-linewidth by using an appropriate exposure dose for the bias exposure(s).

The bias exposure is an additional exposure of a substrate which has been exposed using a mask having a combination of different patterns formed thereon. The additional exposure is effected following the exposure using that mask and before the development process. The additional exposure may be effected by removing that mask and exposing, for a desired exposure time, only that region on the substrate which corresponds to the L-shaped pattern 12, with the remaining region on the substrate which corresponds to the line-and-space pattern 11 being shaded from the exposure light for the additional (bias) exposure. In this embodiment, the bias exposure is effected by exposing the substrate to the exposure light beam not passing the L-shaped pattern 12.

As opposed to the above, if the actual resist-linewidth for the component lines of the L-shaped pattern 12 tends to be smaller then the intended resist-linewidth, one or more bias exposure(s) are effected in which that region on the substrate which corresponds to the L-shaped pattern 12 is shaded from the exposure light for the bias exposure so as to reduce only the resist linewidth of the component lines of the spatially-periodic, line-and-space pattern 11, resulting in a substantially uniform resist-linewidth for the different patterns 11 and 12.

Masks (or reticles) used for the bias exposure may be fabricated in various forms. A mask used for this purpose, called a "bias-exposure mask", may include a transmissive region (or alternatively an opaque region) having the same shape as the L-shaped pattern 12. In a bias-exposure mask of such type, the transmissive region may be larger than and encompass the L-shaped pattern 12 as shown in FIG. 2 (indicating an opaque region by the hatched area) or the opaque region may be larger than and encompass the L-shaped pattern 12 as shown in FIG. 3 (again indicating an opaque region by the hatched area), as long as the transmissive or opaque region would not have any significant effects on the regions of any adjacent patterns. Moreover, a bias-exposure mask having a transmissive (or opaque) region smaller than and encompassed within the L-shaped pattern 12 may be used, as long as the advantages of the bias exposure may be enjoyed.

In this relation, if the resist linewidth varies depending on the direction in which component lines of a pattern extend, such variation in the resist linewidth may be minimized so as to provide a substantially uniform resist linewidth, by effecting the bias exposure exclusively to those regions on the substrate which correspond to the component lines extending in selected directions. For example, in the case where a projection-printing mask having the combination of patterns as shown in FIG. 1 is used, if the horizontal component line of the L-shaped pattern 12 tends to produce a thicker resist line than any vertical component lines, the bias exposure may be effected to the substrate with the regions on the substrate corresponding to any and all the vertical component lines (including those of the line-and-space pattern 11 and that of the L-shaped pattern 12) being shaded from the exposure light for the bias exposure and only the region corresponding to the horizontal component line of the L-shaped pattern 12 being exposed.

Figure 4:
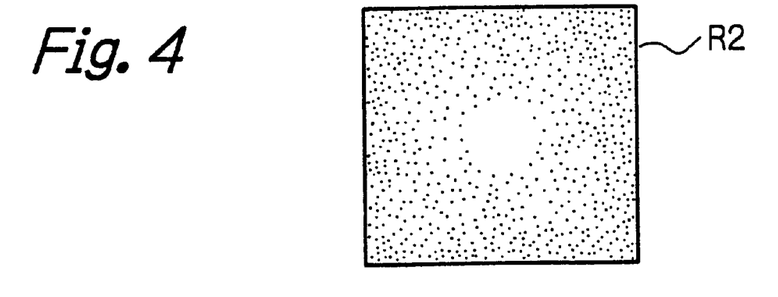
FIG. 4 is a plan view of a dotted bias-mask which may be used with the present invention.

Referring next to FIG. 4, a technique according to a second embodiment of the present invention will be described. FIG. 4 shows a plan view of a bias-exposure mask R2. While the technique according to the first embodiment described above uses the bias-exposure mask including transmissive and opaque regions defined thereon, the bias-exposure mask R2 shown in FIG. 4 has its exposure-energy transmittance continuously varying depending on the position on the mask (i.e., it has gradational transmittance). This type of bias-exposure mask is useful, for example, in the case where the resist linewidth for the component lines of the same linewidth tends to be smaller at positions more distant away from the center of the exposure field. Such variation in the resist linewidth may occur due to possible unevenness in the image-formation characteristics of the projection lens.

Bias-exposure masks having such gradational transmittance may be fabricated in various forms. For example, the gradational transmittance may be obtained by forming a partially-opaque region with a grating having a structure somewhat like that of a diffraction grating and comprising equidistant parallel lines with a pitch smaller than the resolution limit of the projection lens, wherein the linewidths of the parallel lines are so varied as to provide the desired transmittance distribution on the bias-exposure mask. Alternatively, the partially-opaque region may be made by forming on a mask substrate a partially-shading layer of chromium having gradational (or continuously-varying) thickness. Moreover, the partially-opaque region may be made by forming on a mask substrate numerous tiny dots at desired, gradational density so as to provide the desired transmittance distribution on the bias-exposure mask. The bias-exposure mask using such tiny dots is called the "dotted mask". FIG. 4 shows an example of the dotted mask. The size of the dots used for a dotted mask is preferably smaller than the resolution limit of the exposure lens.

With this embodiment, by virtue of the use of a gradational-transmittance bias-exposure mask, a gradational variation in the difference of the actual resist-linewidth form the intended resist-linewidth can be compensated for by a single bias exposure.

Figure 5:
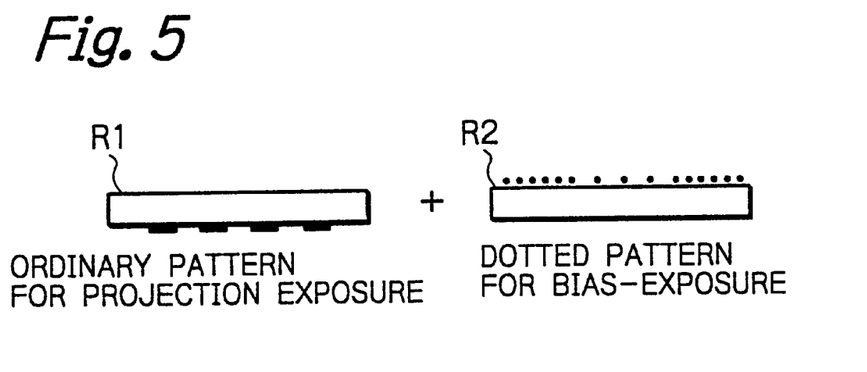
FIG. 5 shows a projection-printing mask and a dotted bias-mask.

FIG. 5 illustrates a technique according to a third embodiment of the present invention. With this embodiment, for a bias exposure process to be subsequently conducted, a projection-printing mask R1 having been used is removed away and replaced by a bias-exposure mask R2. In particular, the bias-exposure mask R2 is placed in position with its dot-bearing surface facing upward, i.e., upside down. Since a typical projection exposure machine is configured such that the underside of a mask will be brought to focus on a wafer, this technique effectively ensures that the image of the dots on a wafer will be sufficiently blurred even if the dots are larger than the resolution limit of the projection lens, so as to enable an appropriate bias exposure process. Also, this technique may be useful for dots smaller than the resolution limit of the projection lens because it improves the safety in blurring the image of the dots.

Figure 6:
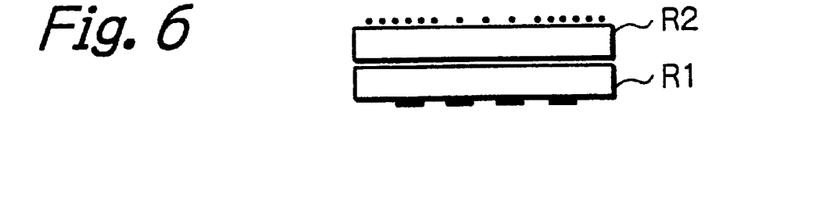
FIG. 6 shows a dotted bias-mask overlaid on a projection-printing mask.

FIG. 6 illustrates a technique according to a fourth embodiment of the present invention. With this embodiment, for the bias exposure to be subsequently conducted, a projection-printing mask R1 (or a first mask) is retained in position and a bias-exposure mask R2 (or a second mask) is overlaid on the first mask R1. Then, an additional (bias) exposure is effected. The bias-exposure mask R2 may be a dotted mask. The dotted mask may be placed in position with its dot-bearing surface facing either upward (as shown in FIG. 6) or downward. In either case, the dot-bearing surface of the dotted mask is located off (distant at least the distance corresponding to the thickness of the projection-printing mask R1) from a conjugate plane which is conjugate to the exposed surface of a wafer, so that the image of the dots will be sufficiently blurred on the wafer. Rather than a dotted mask, the bias-exposure mask R2 may be a mask including transmissive and opaque regions defined thereon, such as described above in conjunction with the first embodiment of the present invention.

The bias exposure may possibly provide undesirable side effects to deteriorate resist image quality in the region to which the bias exposure is effected. For example, the wall angle of the resist image, or the angle formed between the side wall of a resist image and the surface of the substrate, may be decreased to an angle far less than 90 degrees. Further, the variation in the resist linewidth may be exaggerated due to standing wave effects. When standing waves occur, any variation in the thickness of the resist layer, which may result from the irregularities in the substrate surface, can cause undesirable variation in the reflectivity of the substrate surface (although it may be suppressed by forming an antireflection layer between the substrate surface and the resist layer). As the result, the variation in the resist linewidth may be possibly exaggerated by the variation in the exposure intensity over the substrate surface.

The technique according to the fourth embodiment described above may effectively prevent any deterioration of resist image quality which could be otherwise caused by the bias exposure.

In the fourth embodiment, the wafer (resist) is first exposed while using the first mask R1 and then the second mask R2 is overlaid on the first mask R1 for re-exposure of the wafer. For this re-exposure, the second mask R2 may be placed in a plane which is conjugate with the pattern plane of the first mask R1 or a plane spaced from the conjugate plane in the illumination light system for irradiating the first mask with the exposure light, instead of placing the second mask R2 in the vicinity of the first mask R1.

Referring next to FIGS. 7 to 11, an example showing the result of a technique according to the first embodiment of the present invention will be described. With this example, the results of both of an exposure using a conventional exposure method (without the bias exposure) and an exposure using an exposure method according to the present invention (with the bias exposure) are described in comparison. The exposures are conducted using a projection-printing mask having line-and-space patterns and isolated-line patterns. Each line-and-space pattern comprises alternating lines and spaces of the same width of 0.35 $\mu$m, while each isolated-line pattern comprises isolated lines which have no adjacent line nor feature and thus are subject to no or only negligible inter-proximity effects.

Figure 7:
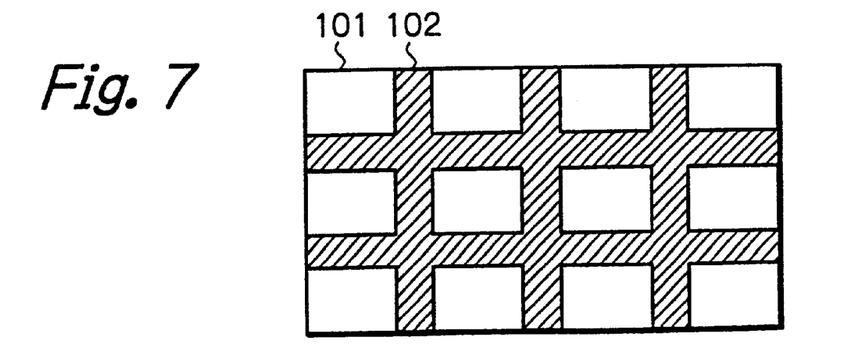
FIG. 7 is a plan view of a projection-printing mask having regions containing crowded lines and the remaining region containing dispersed lines for peripheral circuits.

FIG. 7 illustrates the arrangement of patterns in the exposure field. The nonhatched, rectangular regions 101 confine the line-and-space patterns and are thus highly crowded with lines while the remaining, hatched region 102 confines the isolated-line patterns which are less crowded with lines and form peripheral circuits.

In order to compare the methods, calculations are performed to obtain ED-trees through a computer-based simulation. By using ED-trees, an effective method can be obtained for determining the maximum range of depth of focus within which different patterns on a mask can commonly suffice two provisions: 1) the errors in the resist linewidth for the patterns have to fall within a predetermined, acceptable linewidth range; and 2) the variation in the exposure dose within a predetermined, acceptable exposure range has to be allowed. This method is discussed by B. J. Lin, IEEE. Trans. Electron. Devices ED-27, 931 (1980) and by A. C. Liu and B. J. Lin, IEEE Trans. Electron. Devices ED-30, 1251 (1980).

The calculations to determine the ED-trees were performed for: an NA of the projection exposure lens of 0.6; an NA of the illumination optical system of 0.36; and a wavelength of the exposure light of 365 nm. Further, it was assumed for the calculations that the intended resist-linewidth for the component lines of both the line-and-space patterns and the isolated-line patterns was 0.35 $\mu$m and these patterns were printed simultaneously.

Figure 8:
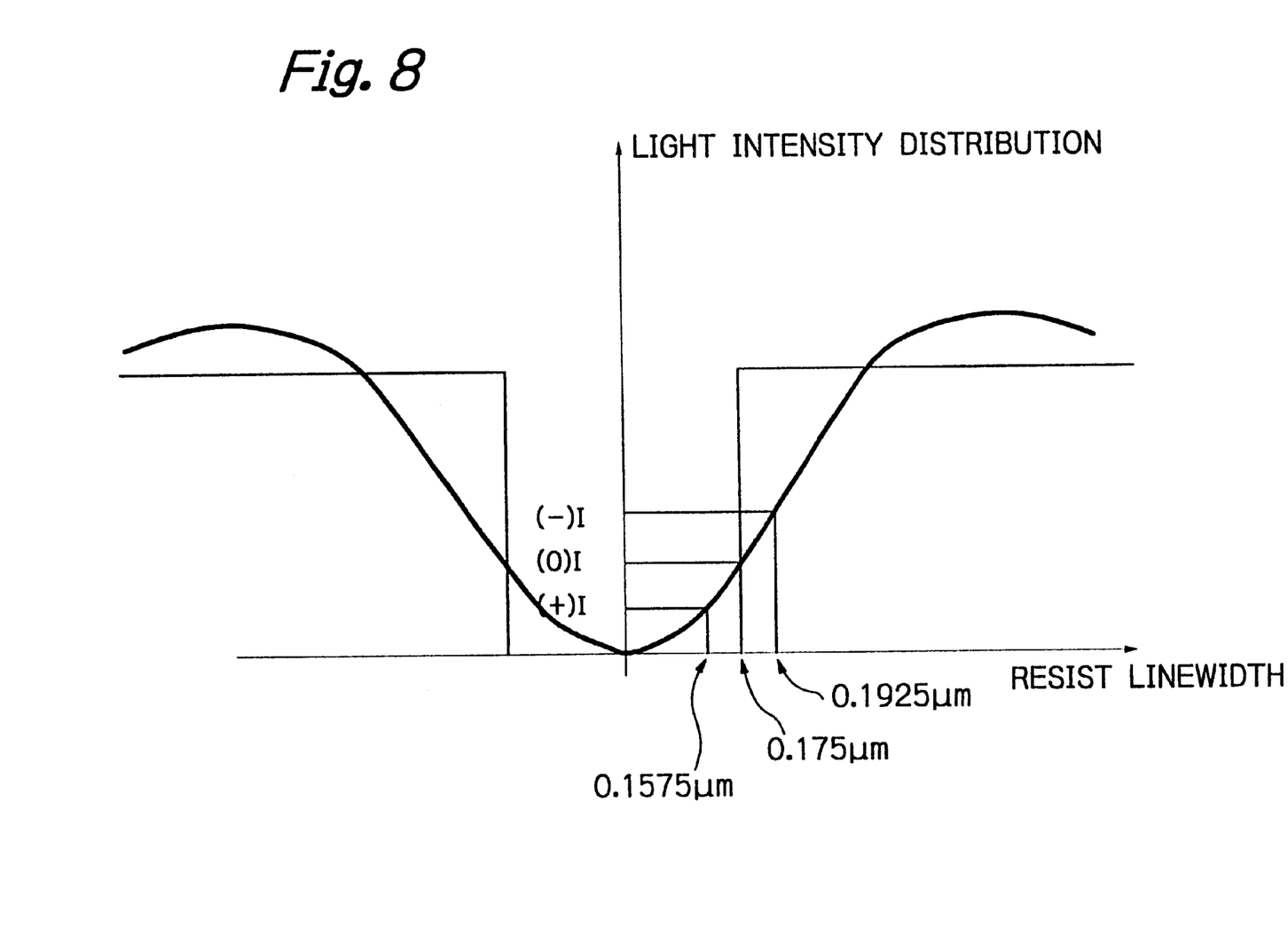
FIG. 8 is a plot showing light intensity distribution profile for an isolated line.

Moreover, it was assumed that the acceptable linewidth range was within ±10% and the exposure dose margin (i.e., the acceptable exposure range) was within ±10%. FIG. 8 shows a light intensity distribution profile on a resist for a masked image of an isolated line. As seen from FIG. 8, an exposure effected at light-intensity level I(0) produces the intended resist-linewidth, whereas light intensity levels I(+) and I(−) correspond to the limits in the light intensity level between which the errors in the resist linewidth can fall within the acceptable linewidth range. The exposure dose margin corresponds to the difference between light intensity levels I(+) and I(−).

Figure 9:
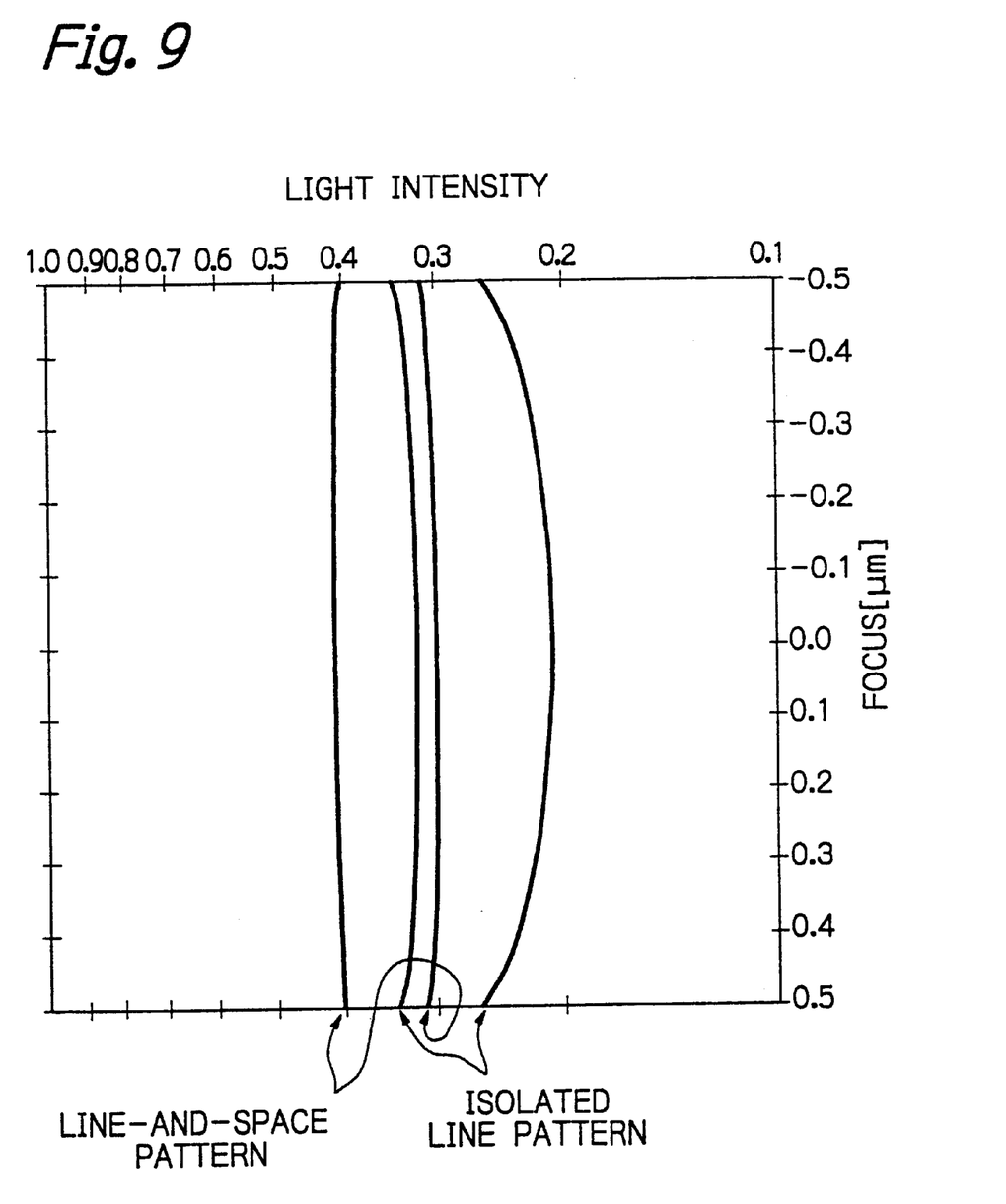
FIG. 9 is a plot showing ED-trees for a line-and-space pattern and an isolated-line pattern on the same scale, obtained without bias exposure.

FIG. 9 is a plot showing ED-trees for a line-and-space pattern and an isolated-line pattern on the same scale, obtained without bias exposure. As seen from the plot, there is no common exposure-focus window because the two patterns have different acceptable exposure range. It is also seen that the energy levels in the acceptable exposure range for the isolated-line pattern are lower than those for the line-and-space pattern.

Figure 10:
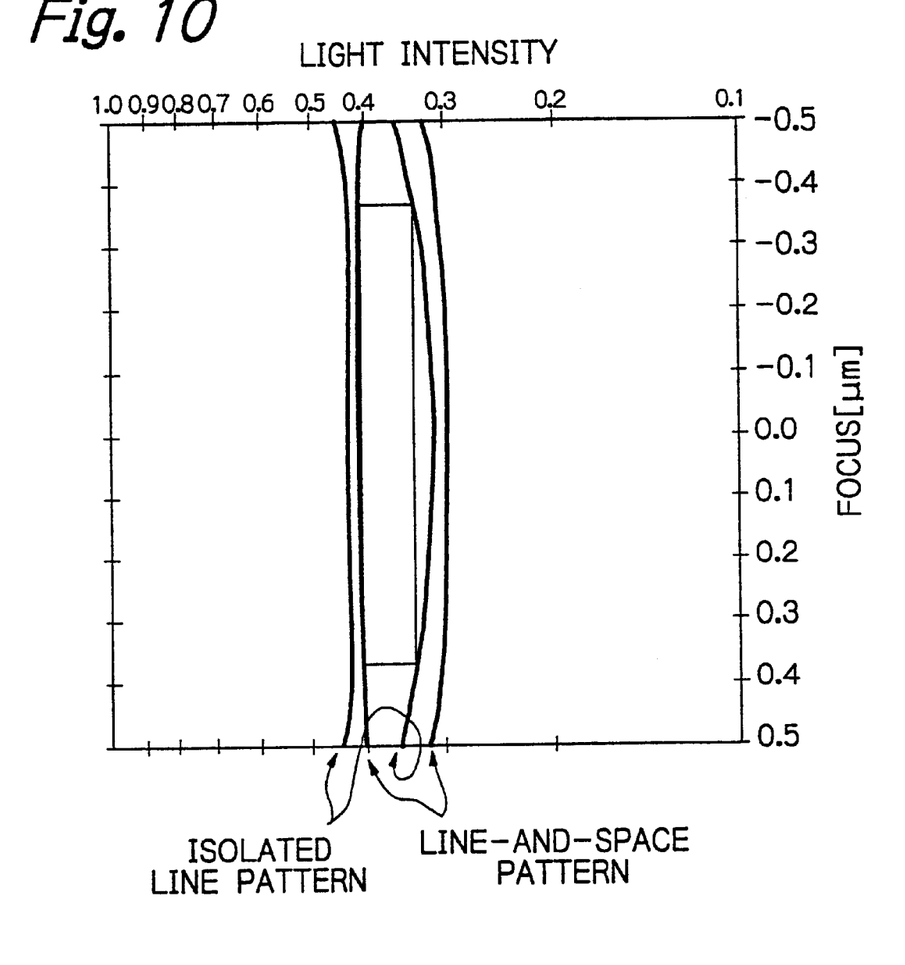
FIG. 10 is a plot showing ED-trees similar to those of FIG. 9, but obtained with bias exposure effected to the region of the isolated-line pattern according to the present invention.
Figure 11:
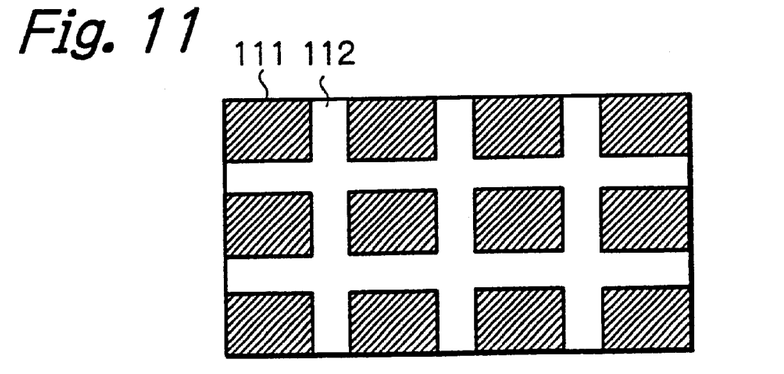
FIG. 11 is a plan view of a bias mask which may be used with the projection-printing mask of FIG. 7.

FIG. 10 is a plot showing ED-trees similar to those of FIG. 9, but obtained with bias exposure effected to the region of the isolated-line pattern according to the present invention. For this plot, an exposure dose for the bias exposure was chosen to be 10% of that for the primary exposure. By virtue of the bias exposure, there appeared an exposure-focus window, within which both of the regions of the line-and-space pattern and the isolated-line pattern can be exposed at acceptable exposure level, and a depth of focus of 0.73 μm was obtained for the window. FIG. 11 is a plan view of the bias-exposure mask which was used for obtaining the results shown in FIG. 10. The bias-exposure mask of FIG. 11 has rectangular opaque regions 111 and the remaining, transmissive region 112, which together serve to only expose the regions on the wafer corresponding to the regions 102 of the projection-printing mask of FIG. 7 while not expose the remaining region on the wafer corresponding to the region 101 of the mask of FIG. 7.

Figure 12:
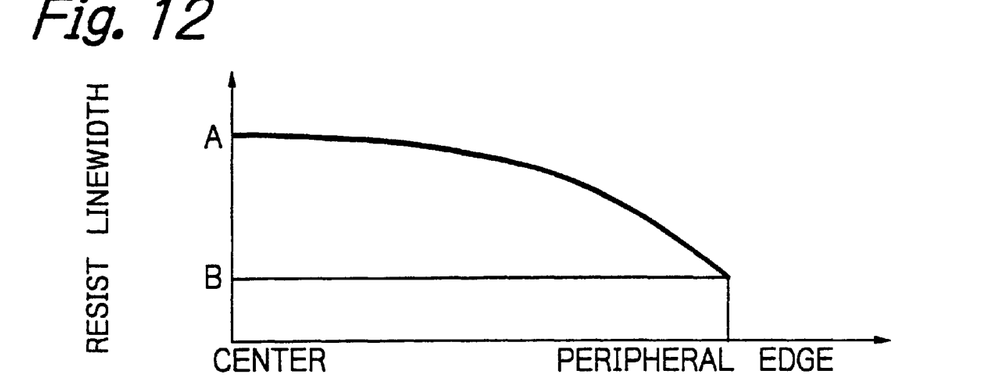
FIG. 12 is a plot illustrating an example of the present invention showing the difference in the resist linewidth between the central and border areas of an exposure field.
Figure 13:
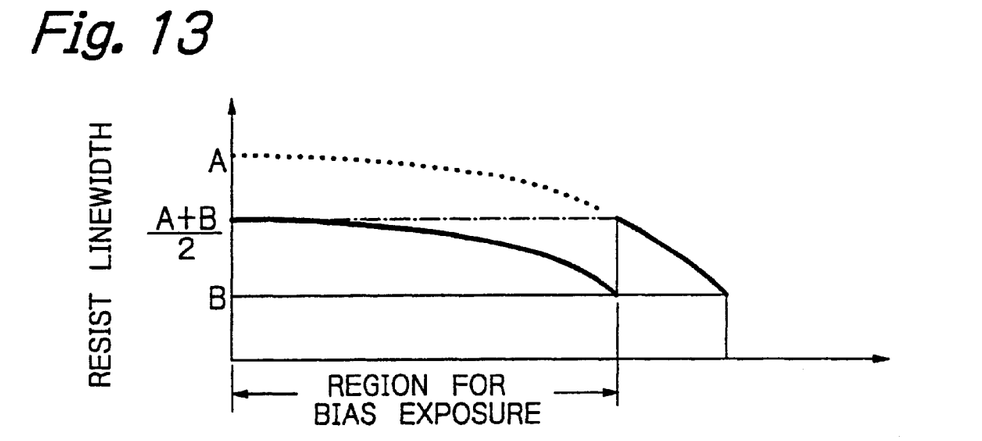
Figure 14:
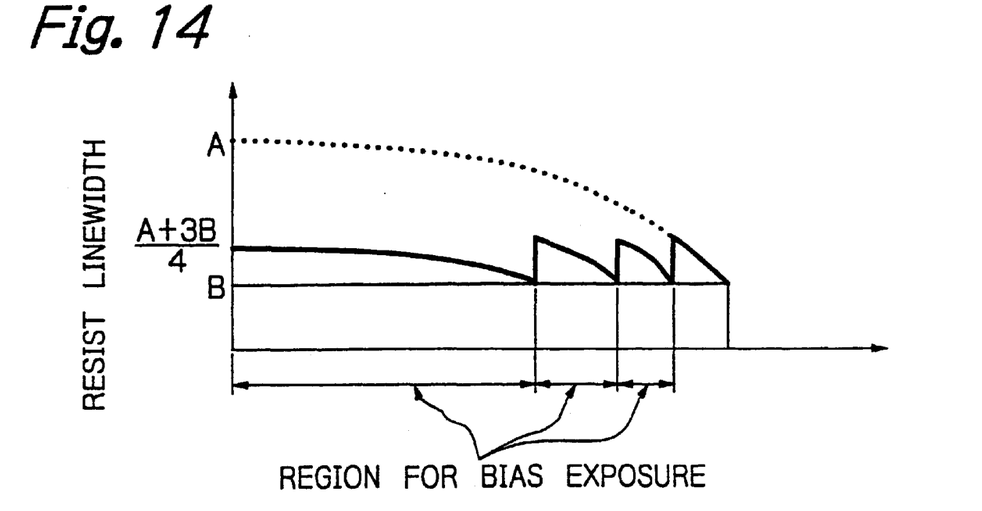

Referring next to FIGS. 12 to 14, further examples will be describe showing the effects of techniques according to the present invention. The technique of the examples are useful where the resist linewidth tends to be smaller at positions near the peripheral edge of the exposure field than at positions near the center thereof, which may be often experienced when the projection lens has uneven image-formation performance over the exposure field.

Assume that the intended resist-linewidth is the same throughout the exposure field while the actual resist-linewidth is A at the center of the exposure field and B at a position on the peripheral edge of the exposure field as shown in FIG. 12. Assume also that those positions at which the resist-linewidth is (A+B)/2 define a circle. Then, the bias exposure may be effected according to the present invention to the circular region inside that circle, with such an exposure dose that will cause the actual resist-linewidth at the center of the exposure field to be equal to (A+B)/2. By effecting such bias exposure, the maximum possible variation in the resist linewidth within the exposure field may be reduced from (A−B) to (A−B)/2, or may be halved, so as to achieve an improvement for the uniform resist-linewidth.

FIG. 14 shows an example in which a number of successive bias exposure processes are incorporated. In this example, three bias exposure processes are repeated and each bias exposure process is conducted at such an exposure level that will reduce the resist linewidth by an amount of (A−B)/4. After completion of the three exposure processes, the resist linewidth at the center of the exposure field will be equal to (A+3B)/4, as seen from FIG. 14. More bias exposure processes may be incorporated to further reduce the maximum possible variation in the resist linewidth in the exposure field.

While each of the examples shown in FIGS. 13 and 14 above uses a bias-exposure mask having full-transmissive and full-opaque regions defined thereon, the bias exposure may be effected using a bias-exposure mask having its energy-transmittance continuously varying throughout the mask such as described in conjunction with the second embodiment, when it is possible to make compensation for the variation in the resist linewidth through a single bias exposure process. The bias-exposure mask having such gradational transmittance may be fabricated in various forms. For example, the gradational transmittance may be obtained by forming a partially-opaque region with a grating having a structure somewhat like that of a diffraction grating and comprising equidistant parallel lines with a pitch smaller than the resolution limit of the projection lens, wherein the linewidths of the parallel lines are so varied as to provide the desired transmittance distribution on the bias-exposure mask. Alternatively, the partially-opaque region may be made by forming on a mask substrate a partially-shading layer of chromium having gradational (or continuously-varying) thickness. Moreover, the partially opaque region may be made by forming on a mask substrate numerous tiny dots at desired, gradational density so as to provide the desired transmittance distribution on the bias-exposure mask. The size of the dots used for a dotted mask shown in FIG. 4 is preferably smaller than the resolution limit of the exposure lens, and the placement of the dotted mask or reticle upside down is useful to blur the image of the dots on the wafer to more extent and thus to improve the safety in blurring the image of the dots, as described above.

Furthermore, it is not necessary for the second mask R2 to have dots on the entire surface thereof. It is possible, for example, for the second mask to have first and second area wherein the first area which receives the exposure light portion to be directed to one of the line-and-space pattern 11 and the L-shaped pattern 12 is provided with dots whereas the second area for receiving the exposure light portion to be directed to the other pattern has no dot.

The first through fourth embodiments have been described on such a premise that a bias exposure is achieved. However, it will be appreciated that the second mask (dotted mask) R2 may be overlaid on the first mask as shown in FIG. 6 in advance of the exposure of the wafer (resist) with using the first mask so that the exposure light is directed to the first mask R1 through the second mask R2 to expose the wafer (resist) to the exposure light reaching from the first mask R1. Assuming here that the first mask R1 has the line-and-space pattern 11 and the L-shaped pattern 12 as shown in FIG. 1, the intensity of the exposure light should be different between these patterns, depending on the difference in density of the dots on the second mask R2 and as a result, areas on the wafer receive different integrated amount of exposure (exposure dose). In the light of this fact, the density of the dots on the second mask R2 is adjusted beforehand depending on exposure dose amounts suitable for transferring the line-and-space pattern and the L-shaped pattern to the wafer, respectively. By this process, it is possible to transfer the line-and-space pattern and the L-shaped pattern to the wafer with suitable exposure dose amounts through a single exposure step, without employing the bias exposure.

Again, it is not necessary for the second mask R2 to have dots on the entire surface thereof. When the linewidth of the L-shaped pattern tends to be greater than the design value, for example, the second mask R2 may be so formed that the first area of the second mask R2 through which the exposure light portion for the L-shaped pattern 12 passes does not have any dots whereas the second area only of the second mask R2 through which the exposure light portion for the line-and-space pattern 11 passes has dots.

Although it is explained in the relevant embodiments that the second mask R2, which is a member independent from the first mask R1, is used to adjust variation of the exposure light intensity in the pattern plane of the first mask R1, it is also possible to form dots on the surface of the first mask R1 which is opposite to the pattern plane.

Furthermore, the second mask R2 (the surface having dots) may be placed in a plane which is conjugate with the pattern plane of the first mask R1 or a plane spaced from the conjugate plane in the illumination light system for irradiating the first mask with the exposure light, instead of placing the second mask R2 in the vicinity of the first mask R1.

When the second mask R2 is placed in a place which is spaced from the pattern plane or its conjugate plane of the first mask R1 in the illumination system, the size of the dots of the second mask R2 may be greater than the resolution power limit, although it is desirable that it is less than the resolution power limit.

On the other hand, when the mask R2 is placed in a plane which is conjugate with the pattern plane of the first mask R1, the size of the dot must be less than the resolution power limit.

Dots may have a transmittance which is not zero. The dots may have a certain transmittance by adjusting the thickness of the film of the dots. Accordingly, it is possible to adjust the transmittance of the second mask R2 by adjusting both of the density of the dots and the film thickness (transmittance) of the dots.

A second mask R2 which has a diffraction grating may be used in place of one having dots. In such mask, the transmittance of the mask may be adjusted by adjusting at least one of the linewidth of the light blocking area of the diffraction grating and the trasnsmittance of the light blocking area. It is also possible to form a second mask to have a light blocking film on the entire surface thereof and adjusting the transmittance by locally changing the thickness of the light blocking film.

Application of the present invention is not limited to a reduction projection exposure apparatus of a step-and-repeat type (stepper) or a reduction projection exposure apparatus of a step-and-scan (scanning stepper) such as one shown in U.S. Pat. No. 5,473,410. The invention is also applicable to any kind of exposure apparatuses including a proximity type and a mirror projection type. As illumination light for exposure, the invention can utilize bright lines emanated from a mercury vapor lamp (g-line, i-line and the like), KrF excimer laser (wavelength 248 nm), ArF excimer laser (wavelength 193 nm), F2 laser (wavelength 157 nm), higher harmonics of YAG laser and metal vapor laser and the like.

The present invention is also applicable to exposure apparatuses using hard X-ray (wavelength in the order of 1 nm for example), or a beam of charged particles (electron ray, ion ray and the like). The invention is also applicable to exposure apparatuses using EUV (Extreme Ultra Violet) light having an oscillation spectrum in a zone of 5–15 nm for example (soft X-ray zone). In projection exposure apparatuses using EUV light, illumination area on a reflective mask is made to have a configuration of an arcuate-slit and a reduction projection optical system comprises a plurality of reflective optical elements (mirrors) only. A pattern of the mask is transferred onto a wafer while moving the wafer and the mask in synchronism in a rate between the speeds of them which is determined by a magnification of the reduction projection optical system. The foregoing second mask R2 may be a reflection type when used in a exposure apparatus using X-ray.

Furthermore, the invention is applicable not only to exposure apparatuses for producing semi-conductor elements but also to exposure apparatuses used in a lithographic process for producing micro-devices such as liquid crystal display elements, camera elements (CCDs and the like), thin film magnetic heads, and reticles.

As apparently understood from the above, according to the present invention, a predetermined region on a resist-coated substrate is subject to an additional (bias) exposure, so that the variation in the resist-linewidth over the exposure field may be compensated for and the process margin may be extended without need for any modification to the mask. Even when the setup and conditions of the projection exposure apparatus and/or the resist have been changed, it is unnecessary to modify the mask, and the exposure dose for the additional (bias) exposure may be adjusted to obtain desirable results.

Having described the present invention with reference to preferred embodiments thereof, it is to be understood that the present invention is not limited to the disclosed embodiments, but may be embodied in various other forms without departing from the spirit and the scope of the present invention as defined by the appended claims.

What is claimed is:

1. An exposure method, comprising:

providing a resist-coated substrate;

providing a first mask having first and second patterns which differ from each other in at least one of a shape and size thereof or optical proximity effect thereof;

conducting a first exposure process in which first and second regions of said substrate are exposed with exposure light through said first mask and in which a first dose of exposure of said substrate is determined in accordance with said first pattern to form an image of said first pattern on said first region by said first exposure process; and conducting a second exposure process in which said second region is exposed with exposure light and in which a second dose of exposure of said substrate is determined in accordance with said second pattern to form an image of said second pattern on said second region and to control a size of the formed image by said first and second exposure processes.

2. An exposure method as set form in claim 1, wherein:

said second exposure process comprises the step of irradiation onto said second region of said substrate; said exposure light having substantially uniform intensity distribution at said second region of said substrate.

3. An exposure method as set forth in claim 2, wherein:

said second exposure process comprises the steps of removing said first mask and providing a second mask having an opaque region corresponding to said first pattern of said first mask.

4. An exposure method as set forth in claim 1, wherein:

said second exposure process the step of projecting again said second pattern of said first mask onto said substrate so as to make additional exposure of said second region of said substrate.

5. An exposure method as set forth in claim 4, wherein:

said step of projecting again said pattern in said second region of said first mask onto said substrate comprises the step of providing a second mask to be overlaid on said first mask, said second mask having an opaque region corresponding to said first region of said first mask.

6. An exposure method, comprising the steps of:

providing a resist-coated substrate;

providing a first mask including a predetermined region having a pattern formed therein;

conducting a first exposure process in which said pattern in said predetermined region of said first mask is projected onto said substrate so as to expose a region of said substrate;

providing a second mask including a partially-opaque region corresponding to said predetermined region of said first mask, said partially-opaque region having transmittance gradually varying on the second mask; and conducting a second exposure process in which said second mask is used to make an exposure of said substrate onto which said pattern is projected in said first exposure process.

7. An exposure method as set forth in claim 6, wherein; said second exposure process is conducted with said first mask removed after completion of said first exposure process.

8. An exposure method as set forth in claim 6, wherein: said second exposure process is conducted with said second mask overlaid on said first mask after completion of said first exposure process.

9. An exposure method as set forth in claim 6, wherein: said step of providing said second mask comprises the step of positioning said partially-opaque region in a plane apart from a conjugate plane that is conjugate to a surface of said substrate and on which said pattern is disposed in said first exposure process.

10. A method for fabricating a semiconductor device, comprising;

providing a resist-coated substrate;

providing a first mask having first and second patterns which differ from each other in at least one of a shape and a size thereof or optical proximity effect thereof;

conducting a first exposure process in which first and second regions of said substrate are exposed with exposure light through said first mask and in which a first dose of exposure of said substrate is determined in accordance with said first pattern to form an image of said first pattern on said first region by said first exposure process;

conducting a second exposure process in which said second region is exposed with said exposure light and in which a second dose of exposure of said substrate is determined in accordance with said second pattern to form an image of said second pattern on said second region and to control a size of the formed image by said first and second exposure processes; and processing said substrate so as to form therefrom a semiconductor device.

11. A method for fabricating a semiconductor device, comprising;

providing a resist-coated substrate;

providing a first mask including a predetermined region having a pattern formed therein;

conducting a first exposure process in which said pattern in said predetermined region of said first mask is projected onto said substrate so as to expose a region of said substrate;

providing a second mask including a partially-opaque region corresponding to said predetermined region of said first mask, said partially-opaque region having transmittance gradually varying on the second mask;

conducting a second exposure process in which said second mask is used to make an exposure of said substrate onto which said pattern is projected in said first exposure process; and processing said substrate so as to form therefrom a semiconductor device.

12. A method of manufacturing a micro-device comprising:

providing a substrate having a resist thereon;

providing a mask having first and second patterns which differ from each other in at least one of shape and size thereof;

illuminating the mask with an energy ray having a first intensity on a first area of said resist determined in accordance with said first pattern and a second intensity different from said first intensity on a second area of said resist determined in accordance with said second pattern; and exposing said first and second areas with said illuminated mask to transfer said first and second patterns onto said first and second areas, respectively, said first area having a first dose of exposure by irradiation of said energy ray having the first intensity and said second area having a second dose of exposure different from said first dose by irradiation of said energy ray having the second intensity.

13. A method according to claim 12, wherein:

intensities of said energy ray incident on said first and second patterns are different from each other to have said different first and second doses of exposure on said first and second areas.

14. A method according to claim 13, further comprising the step of providing an intensity adjusting element having areas corresponding to said first and second areas of the mask, said areas of the intensity adjusting element having different transmittance or reflectivity to said energy ray, wherein:

said intensity adjusting element is placed on the side of the pattern plane of the mask closer to a source of said energy ray.

15. A method according to claim 12, wherein;

said first and second patterns differ from each other in at least one of a shape and size thereof, or optical proximity effect thereof.

* * * * *